(12) United States Patent
Yu et al.

(10) Patent No.: US 6,444,575 B1
(45) Date of Patent: Sep. 3, 2002

(54) METHOD FOR FORMING A BITLINE CONTACT VIA WITHIN A MEMORY CELL STRUCTURE

(75) Inventors: Chih-Hsing Yu, Hsin-Chu; Yeur-Luen Tu, Taichung, both of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/918,084

(22) Filed: Jul. 30, 2001

(51) Int. Cl.$^7$ .......................................... H01L 21/4763
(52) U.S. Cl. ...................... 438/639; 438/239; 438/256; 438/390; 438/399; 438/253; 438/637; 438/672
(58) Field of Search ................................. 438/239, 256, 438/399, 637, 639, 672, 253, 396

(56) References Cited

U.S. PATENT DOCUMENTS

| | | | |
|---|---|---|---|
| 5,308,793 A | * | 5/1994 | Taguchi et al. |
| 5,362,666 A | | 11/1994 | Dennison |
| 5,970,374 A | * | 10/1999 | Teo .............................. 438/629 |
| 5,985,754 A | * | 11/1999 | Aizawa ....................... 438/639 |
| 6,127,260 A | | 10/2000 | Huang |
| 6,136,695 A | | 10/2000 | Lee et al. |
| 6,291,340 B1 | * | 9/2001 | Sandhu et al. ............... 438/637 |
| 6,200,849 B1 | * | 3/2002 | Kim ............................ 438/241 |

* cited by examiner

Primary Examiner—Long Pham
(74) Attorney, Agent, or Firm—Tung & Associates (57) ABSTRACT

Within a method for forming a contact via there is provided a substrate having formed thereover a pair of topographic structures separated by a contact region formed within the substrate. There is then formed upon the substrate and the pair of topographic structures a blanket conformal isolation layer which has formed thereupon a blanket variable thickness masking layer formed thicker over the pair of topographic structures than interposed between the pair of topographic structures. The blanket variable thickness masking layer and the blanket conformal isolation layer are then completely etched through interposed between, but not over, the pair of topographic structures to thus form the contact via. The method is useful for forming bitline contact vias within memory cell structures.

17 Claims, 3 Drawing Sheets

METHOD FOR FORMING A BITLINE CONTACT VIA WITHIN A MEMORY CELL STRUCTURE

BACKGROUND OF THE INVENTION

1. Field of the Invention

The present invention relates generally to memory cell structures employed within semiconductor integrated circuit microelectronic fabrications. More particularly, the present invention relates to methods for forming memory cell structures employed within semiconductor integrated circuit microelectronic fabrications.

2. Description of the Related Art

Semiconductor integrated circuit microelectronic fabrications are formed from semiconductor substrates within and upon which are formed semiconductor devices, and over which are formed patterned conductor layers which are separated by dielectric layers.

Common in the art of semiconductor integrated circuit microelectronic fabrication, and in particular in the art of semiconductor integrated circuit microelectronic memory fabrication, is the use and the fabrication of memory cell structures, and in particular dynamic random access memory (DRAM) cell structures. Dynamic random access memory (DRAM) cell structures typically comprise at least one field effect transistor (FET) device formed within and upon a semiconductor substrate, where one of a pair of source/drain regions within the field effect transistor (FET) device has formed thereover and electrically connected therewith a storage capacitor. Within a dynamic random access memory (DRAM) cell structure, a gate electrode of the field effect transistor (FET) device serves as a wordline which provides a switching function for charge introduction into and retrieval from the storage capacitor, while the other of the pair of source/drain regions within the field effect transistor (FET) device serves as a contact for a bitline conductor stud layer which introduces or retrieves charge with respect to the storage capacitor.

While the dynamic random access memory (DRAM) cell structure has clearly become ubiquitous in the art of semiconductor integrated circuit microelectronic memory fabrication, and is thus essential in the art of semiconductor integrated circuit microelectronic fabrication, the dynamic random access memory (DRAM) cell structure is nonetheless not entirely without problems in the art of semiconductor integrated circuit microelectronic memory fabrication.

In that regard, as semiconductor integrated circuit microelectronic fabrication integration levels have increased and semiconductor device and patterned conductor layer dimensions have decreased, it has become increasingly difficult in the art of semiconductor integrated circuit microelectronic fabrication, and in particular in the art of semiconductor integrated circuit microelectronic memory fabrication, to readily form dynamic random access memory (DRAM) cell structures with enhanced reliability and enhanced performance.

It is thus desirable in the art of semiconductor integrated circuit microelectronic fabrication, and in particular in the art of semiconductor integrated circuit microelectronic memory fabrication, to provide methods and materials through which there may readily be formed, with enhanced reliability and enhanced performance, dynamic random access memory (DRAM) cell structures.

It is towards the foregoing object that the present invention is directed.

Various methods have been disclosed in the art of semiconductor integrated circuit microelectronic fabrication for forming, with desirable properties, dynamic random access memory (DRAM) cell structures.

Included among the methods, but not limited among the methods, are methods disclosed within: (1) Dennison, in U.S. Pat. No. 5,362,666 (a method for forming a capacitor and bitline structure within a dynamic random access memory (DRAM) cell structure for use within a semiconductor integrated circuit microelectronic memory fabrication, with enhanced bitline stud layer reliability and performance, by forming a bitline contact via through a capacitor plate layer which is spaced from a bitline contact region by a capacitor node dielectric layer); (2) Huang, in U.S. Pat. No. 6,127,260 (a method for forming a capacitor and peripheral conductor contact structure within a dynamic random access memory (DRAM) cell structure for use within a semiconductor integrated circuit microelectronic memory fabrication, with enhanced peripheral contact structure reliability, by forming a peripheral contact via in multiple vertical stages, where at least one stage is formed with a "T" shape); and (3) Lee et al., in U.S. Pat. No. 6,136,695 (a method for forming a self aligned contact (SAC) structure which may be used as a bitline contact structure within a dynamic random access memory (DRAM) cell structure for use within a semiconductor integrated circuit microelectronic memory fabrication, with enhanced reliability, by forming a contact spacer layer subsequent to, rather than prior to, forming a patterned premetal dielectric (PMD) layer which accesses a contact region).

Desirable in the art of semiconductor integrated circuit microelectronic fabrication, and in particular in the art of semiconductor integrated circuit microelectronic memory fabrication, are additional methods and materials which may be employed for forming, with enhanced reliability and enhanced performance, dynamic random access memory (DRAM) cell structures.

It is towards the foregoing object that the present invention is directed.

SUMMARY OF THE INVENTION

A first object of the invention is to provide a method for forming a dynamic random access memory (DRAM) cell structure within a semiconductor integrated circuit microelectronic fabrication.

A second object of the present invention is to provide a method in accord with the first object of the present invention, wherein the dynamic random access memory (DRAM) cell structure is formed with enhanced reliability and enhanced performance.

A third object of the present invention is to provide a method in accord with the first object of the present invention and the second object of the present invention, wherein the method is readily commercially implemented.

In accord with the objects of the present invention, there is provided by the present invention a method for forming a contact via.

To practice the method of the present invention, there is first provided a substrate having formed therein a contact region. There is also formed over the substrate a pair of topographic structures which is separated by the contact region. There is then formed upon the substrate and the pair of topographic structures a blanket conformal isolation layer having an upper region formed upon the pair of topographic structures and a lower region formed interposed between the pair of topographic structures and over the contact region.

There is then formed upon the blanket conformal isolation layer a blanket variable thickness masking layer having a greater thickness upon the upper region of the blanket conformal isolation layer than upon the lower region of the blanket conformal isolation layer. Finally, there is then etched completely through the blanket variable thickness masking layer and the blanket conformal isolation layer at the lower region of the blanket conformal isolation layer but not,the upper region of the blanket conformal isolation layer to form a pair of patterned conformal isolation layers and patterned variable thickness masking layers which define a contact via exposing the contact region.

The present invention may be employed for forming as the contact via in accord with the present invention a bitline contact via within a memory cell structure, such as a dynamic random access memory (DRAM) memory cell structure.

The present invention provides a method for forming a dynamic random access memory (DRAM) cell structure within a semiconductor integrated circuit microelectronic fabrication, wherein the dynamic random access memory (DRAM) cell structure is formed with enhanced reliability and enhanced performance.

The present invention realizes the foregoing object when forming a bitline contact via within the dynamic random access memory (DRAM) cell structure a self aligned masking method which employs formed upon a pair of topographic structures formed upon a substrate and separated by a contact region formed within the substrate: (1) a blanket conformal isolation layer, in turn having formed thereupon; (2) a blanket variable thickness masking layer having a greater thickness upon the blanket conformal isolation layer over the pair of topographic structures than interposed between the pair of topographic structures. Thus, there may be completely etched through the blanket variable thickness masking layer and the blanket conformal isolation layer interposed between the pair of topographic structures, but not completely through the blanket variable thickness masking layer or blanket conformal isolation layer over the pair of topographic structures, to form a pair of patterned conformal isolation layers and a pair of patterned variable thickness masking layers which define a contact via accessing the contact region.

The method of the present invention is readily commercially implemented.

The present invention employs methods and materials as are generally known in the art of semiconductor integrated circuit microelectronic fabrication, but employed within the context of specific process orderings and specific materials limitations to provide the method of the present invention. Since it is thus at least in part a specific process ordering and a specific materials limitation which provide at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

Although the preferred embodiment of the present invention illustrates the present invention most particularly within the context of forming a bitline contact via within a capacitor under bitline (CUB) dynamic random access memory (DRAM) cell structure, the present invention may nonetheless be employed for forming contact and interconnection vias within structures including but not limited to memory cell structures. In that regard, while the preferred embodiment of the present invention provides for forming a bitline contact via interposed between a pair of capacitor structures as a pair of topographic structures, with a general embodiment of the present invention, the present invention may be employed for forming a contact via interposed between a pair of topographic structures other than topographic capacitor structures. Such other topographic structures may include, but are not limited to topographic conductor structures, topographic semiconductor structures and topographic dielectric structures.

Referring now to FIG. 1 to FIG. 5, there is shown a series of schematic cross-sectional diagrams illustrating the results of progressive stages in forming, in accord with a preferred embodiment of the present invention, a dynamic random access memory (DRAM) cell structure within a semiconductor integrated circuit microelectronic fabrication.

Figure 1:
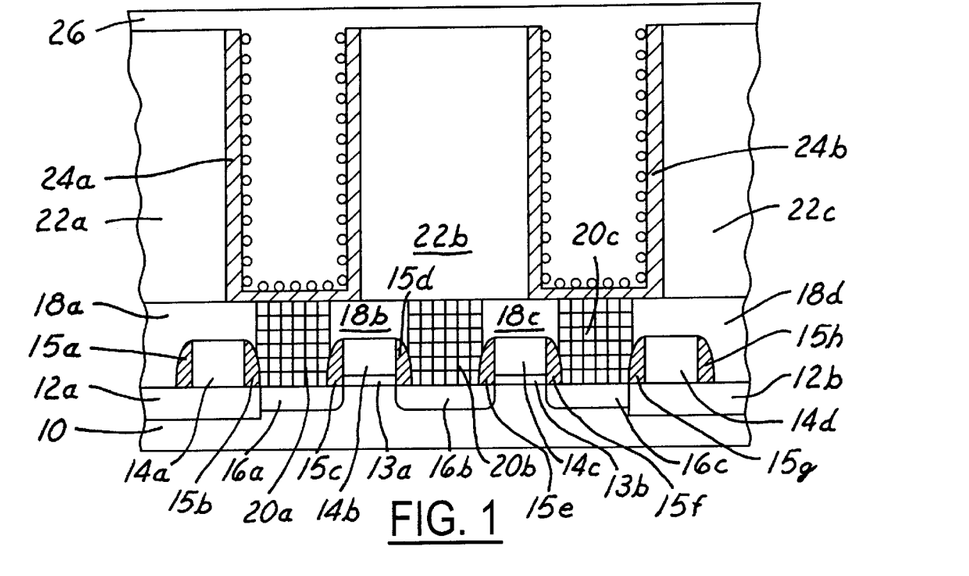
FIG. 1, FIG. 2, FIG. 3, FIG. 4 and FIG. 5 show a series of schematic cross-sectional diagrams illustrating the results of progressive stages in forming, in accord with a preferred embodiment of the present invention, a dynamic random access memory (DRAM) cell structure within a semiconductor integrated circuit microelectronic fabrication.

Shown in FIG. 1 is a schematic cross-sectional diagram of the semiconductor integrated circuit microelectronic fabrication at an early stage in its fabrication in accord with the preferred embodiment of the present invention.

Shown within FIG. 1, in a first instance, is a semiconductor substrate 10 having formed therein a pair of isolation regions 12a and 12b.

Within the preferred embodiment of the present invention with respect to the semiconductor substrate 10, and although semiconductor substrates are known in the art of semiconductor integrated circuit microelectronic fabrication with either dopant polarity, several dopant concentrations and various crystallographic orientations, for the preferred embodiment of the present invention, the semiconductor substrate 10 is typically and preferably a (100) silicon semiconductor substrate having at least either N- or P-doped regions.

Similarly, within the preferred embodiment of the present invention with respect to the pair of isolation regions 12a and 12b, and although it is also known in the art of semiconductor integrated circuit microelectronic fabrication that isolation regions may be formed employing methods including but not limited to isolation regions thermal growth methods and isolation region deposition/patterning methods, for the preferred embodiment of the present invention, the isolation regions 12a and 12b are, as is illustrated within the schematic cross-sectional diagram of FIG. 1, formed as shallow trench isolation (STI) regions formed at least in part of a silicon oxide material formed within the semiconductor substrate 10.

Shown also within the schematic cross-sectional diagram of FIG. 1, and formed upon the active region of the semiconductor substrate defined by the pair of isolation regions 12a and 12b, is a pair of field effect transistor (FET) devices comprising: (1) a pair of gate dielectric layers 13a and 13b formed upon the active region of the semiconductor substrate 10; (2) a pair of gate electrodes 14b and 14c aligned upon the pair of gate dielectric layers 13a and 13b; (3) a series of spacer layers 15c, 15d, 15e and 15f formed adjoining a pair of opposite edges of the pair of gate dielectric layers 13a and 13b and the pair of gate electrodes 14b and 14c; and (4) a series of source/drain regions 16a, 16b and 16c formed within the active region of the semiconductor substrate and separated by the pair of gate electrodes 14b and 14c. Similarly, there is also shown within the schematic cross-sectional diagram of FIG. 1 a pair of interconnect structures which comprises: (1) a pair of interconnect layers 14a and 14d formed upon the corresponding isolation regions 12a and 12b; and (2) a series of spacer layers 15a, 15b, 15g and 15h formed adjacent a series of sidewalls of the pair of interconnect layers 14a and 14b.

Within the preferred embodiment of the present invention with respect to each of the foregoing series of structures which comprises the pair of field effect transistor (FET) devices and the pair of interconnect structures, each of the foregoing series of structures which comprises the pair of field effect transistor (FET) devices and the pair of interconnect structures may be formed employing methods and materials as are conventional in the art of semiconductor integrated circuit microelectronic fabrication.

For example, and without limitation, the pair of gate dielectric layers 13a and 13b is typically and preferably, although not exclusively, formed of a silicon oxide gate dielectric material thermally grown upon the active region of the semiconductor to a thickness of from about 50 to about 150 angstroms. In addition, and also for example, and also without limitation, the pair of gate electrodes 14b and 14c, as well as the pair of interconnect layers 14a and 14d, are typically and preferably, but not exclusively, formed of a gate electrode material such as but not limited to a metal, metal alloy, doped polysilicon (having a dopant concentration of greater than about 5E20 dopant atoms per cubic centimeter) or polycide (doped polysilicon/metal silicide stack) gate electrode material, formed to a thickness of from about 500 to about 2000 angstroms (although doped polysilicon and polycide gate electrode materials are typically preferred). Further, and also for example, and also without limitation, the series of spacer layers 15a, 15b, 15c, 15d, 15e, 15f, 15g and 15h is typically and preferably formed of a dielectric spacer material, such as but not limited to a silicon nitride dielectric spacer material or a silicon oxynitride dielectric spacer material, formed in a spacer shape while employing an anisotropic etching method. Finally, and also for example, and also without limitation, the series of source/drain regions 16a, 16b and 16c is typically and preferably formed employing an ion implantation method which employs a generally low ion implantation dose, while employing the pair of gate electrodes 14b and 14c as a mask. Typically and preferably the ion implantation method employs an ion implantation dose of from about 1E13 to about 1E14 dopant atoms per square centimeter and an ion implantation energy of from about 10 to about 30 kev.

Shown also within the schematic cross-sectional diagram of FIG. 1, and formed passivating the pair of field effect transistor (FET) devices and the pair of interconnect structures, is a series of patterned planarized pre-metal dielectric (PMD) layers 18a, 18b, 18c and 18d which defines a series of three first apertures within which is formed a series of three conductive landing studs 20a, 20b and 20c.

Within the first preferred embodiment of the present invention with respect to the series of patterned planarized pre-metal dielectric layers 18a, 18b, 18c and 18d, the series of patterned planarized pre-metal dielectric layers 18a, 18b, 18c and 18d is typically and preferably formed of a silicon oxide dielectric material layer deposited employing a plasma enhanced chemical vapor deposition (PECVD) method, formed and planarized to a thickness of from about 5000 to about 10000 angstroms passivating the pair of field effect transistor (FET) devices and the pair of interconnect structures. The planarized silicon oxide dielectric material layer, which may preferably and optionally have formed thereupon a blanket etch stop layer, is then patterned to form the series of three first apertures which accesses the series of source/drain regions 16a, 16b and 16c.

Similarly, once having formed the series of patterned planarized pre-metal dielectric (PMD) layers 18a, 18b, 18c and 18d, the series of conductive landing studs 20a, 20b and 20c is typically and preferably formed within the series of three first apertures defined by the series of patterned planarized pre-metal dielectric (PMD) layers 18a, 18b, 18c and 18d, while employing a blanket deposition and chemical mechanical polish (CMP) planarizing method. Although the series of conductive landing studs 20a, 20b and 20c may be formed from any of several conductor materials, including but not limited to metal, metal alloy, doped polysilicon and polycide conductor materials, for the preferred embodiment of the present invention, the series of conductive landing studs 20a, 20b and 20c is typically and preferably formed of a doped polysilicon conductor material.

Shown also within the schematic cross-sectional diagram of FIG. 1, and formed upon the series of patterned planarized premetal dielectric (PMD) layers 18a, 18b, 18c and 18d, is a series of patterned capacitor node dielectric layers 22a, 22b and 22c which defines a pair of second apertures which leave exposed upper portions of the pair of conductive landing studs 20a and 20c. Similarly, there is also shown within the schematic cross-sectional diagram of FIG. 1, and formed conformally within and extending above the pair of second apertures defined by the series of patterned capacitor node dielectric layers 22a, 22b and 22c, a pair of patterned conformal first capacitor plate layers 24a and 24b which serves as a pair of capacitor node layers.

Within the preferred embodiment of the present invention with respect to the series of patterned capacitor node dielectric layers 22a, 22b and 22c, the series of patterned capacitor node dielectric layers 22a, 22b and 22c is typically formed of a dielectric material generally analogous to the dielectric material from which is formed the series of patterned planarized pre-metal dielectric (PMD) layers 18a, 18b, 18c and 18d, but with an etch specificity with respect to the dielectric material from which is formed the series of patterned planarized pre-metal dielectric (PMD) layers 18a, 18b, 18c and 18d (or a series of optional patterned etch stop layers formed thereupon). Typically and preferably, under circumstances where the series of patterned planarized pre-metal dielectric (PMD) layers 18a, 18b, 18c and 18d is formed of a silicon oxide dielectric material deposited employing a plasma enhanced chemical vapor deposition (PECVD) method, the series of patterned capacitor node dielectric layers 22a, 22b and 22c is formed of a less dense silicon oxide dielectric material formed employing a low pressure chemical vapor deposition (LPCVD) method, or of an otherwise lower dielectric constant dielectric material. Similarly, within the preferred embodiment of the present invention with respect to the pair of patterned conformal first capacitor plate layers 24a and 24b, and although other methods and materials may be employed in forming the pair of patterned conformal first capacitor plate layers 24a and 24b, the pair of patterned conformal first capacitor plate layers 24a and 24b is typically and preferably formed of a doped polysilicon material, typically and preferably also formed, as is illustrated within the schematic cross-sectional diagram of FIG. 1, with a hemispherical surface grain, in order to provide enhanced surface area of the pair of patterned conformal first capacitor plate layers 24a and 24b.

As is understood by a person skilled in the art, in order to form the series of patterned capacitor node dielectric layers 22a, 22b and 22c as illustrated within the schematic cross-sectional diagram of FIG. 1, along with the pair of patterned conformal first capacitor plate layers 24a and 24b as illustrated within the schematic cross-sectional diagram of FIG. 1, there is first formed a blanket capacitor node dielectric layer which is patterned to form the series of patterned capacitor node dielectric layers which defines the pair of second apertures which exposes upper portions of the pair of conductive landing studs 20a and 20c. There is then formed conformally upon exposed surfaces of the series of patterned capacitor node dielectric layers and contacting the pair of conductive landing studs 20a and 20c a blanket conformal first capacitor plate layer which is subsequently chemical mechanical polish (CMP) planarized to form the pair of patterned conformal first capacitor plate layers 24a and 24b.

Typically and preferably, each of the series of patterned capacitor node dielectric layers 22a, 22b and 22c is formed to a thickness of from about 10000 to about 25000 angstroms. Typically and preferably, each of the pair of patterned conformal first capacitor plate layers 24a and 24b is formed to a thickness of from about 500 to about 1500 angstroms.

Finally, there is also illustrated within the schematic cross-sectional diagram of FIG. 1, and formed upon exposed portions of the series of patterned capacitor node dielectric layers 22a, 22b and 22c, and the pair of patterned conformal first capacitor plate layers 24a and 24b, a blanket second capacitor plate layer 26. Also present within the semiconductor integrated circuit microelectronic fabrication whose schematic cross-sectional diagram is illustrated in FIG. 1, but not specifically illustrated within the semiconductor integrated circuit microelectronic fabrication whose schematic cross-sectional diagram is illustrated in FIG. 1, is a blanket capacitor dielectric layer which is first formed upon exposed portions of the series of patterned capacitor node dielectric layers 22a, 22b and 22c, and the pair of patterned conformal first capacitor plate layers 24a and 24b, prior to forming thereupon and thereover the blanket second capacitor plate layer 26.

Within the preferred embodiment of the present invention with respect to the blanket capacitor dielectric layer which is not otherwise specifically illustrated within the schematic cross-sectional diagram of FIG. 1, the blanket capacitor dielectric layer is typically and preferably formed as a laminate of silicon oxide and silicon nitride dielectric materials, formed to a thickness of from about 40 to about 60 angstroms.

Within the preferred embodiment of the present invention with respect to the blanket second capacitor plate layer 26, the blanket second capacitor plate layer 26 is typically and preferably formed employing methods, materials and thickness dimensions analogous or equivalent to the methods, materials and thickness dimensions as employed for forming the pair of patterned conformal first capacitor plate layers 24a and 24b. Typically and preferably, the blanket second capacitor plate layer 26 is formed such as to fill the pair of cavities defined by the pair of patterned conformal first capacitor plate layers 24a and 24b.

Figure 2:
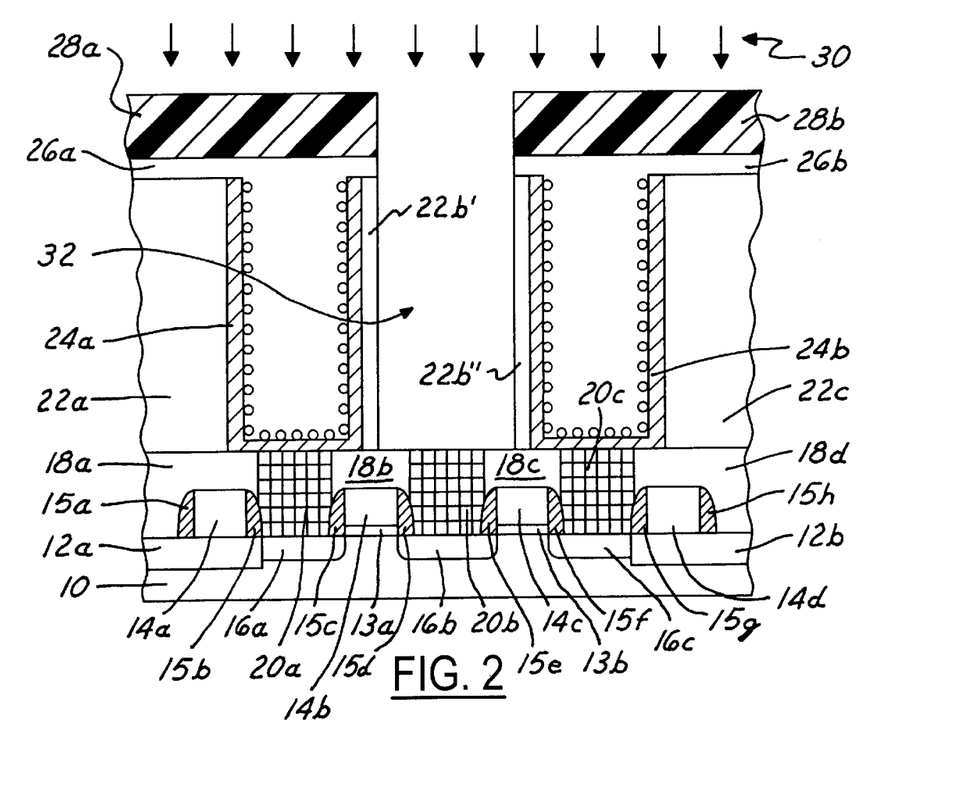

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein there is formed upon the blanket second capacitor plate layer 26 a pair of patterned photoresist layers 28a and 28b. Within the preferred embodiment of the present invention, the pair of patterned photoresist layers 28a and 28b is otherwise generally conventional in the art of semiconductor integrated circuit microelectronic fabrication, and formed to a thickness of from about 5000 to about 10000 angstroms. As is also shown within the schematic cross-sectional diagram of FIG. 2, the blanket second capacitor plate layer 26 and the patterned capacitor node dielectric layer 22b have been sequentially patterned, while employing the pair of patterned photoresist layers 28a and 28b as an etch mask layer, and in conjunction with a first etching plasma 30, to form a pair of patterned second capacitor plate layers 26a and 26b, and a pair of twice patterned capacitor node dielectric layers 22b' and 22b", which in an aggregate define a contact aperture 32 having exposed within its floor the conductive landing stud 20b.

Within the preferred embodiment of the present invention, the first etching plasma 30 may employ an etchant gas composition (or series thereof) as is conventional in the art of semiconductor integrated circuit microelectronic fabrication, and will typically and preferably employ: (1) a chlorine containing etchant gas composition for etching through the blanket second capacitor plate layer 26 to form the pair of patterned second capacitor plate layers 26a and 26b; and (2) a fluorine containing etchant gas composition for etching through the patterned capacitor node dielectric layer 22b to form the pair of twice patterned capacitor node dielectric layers 22b' and 22b".

Figure 3:
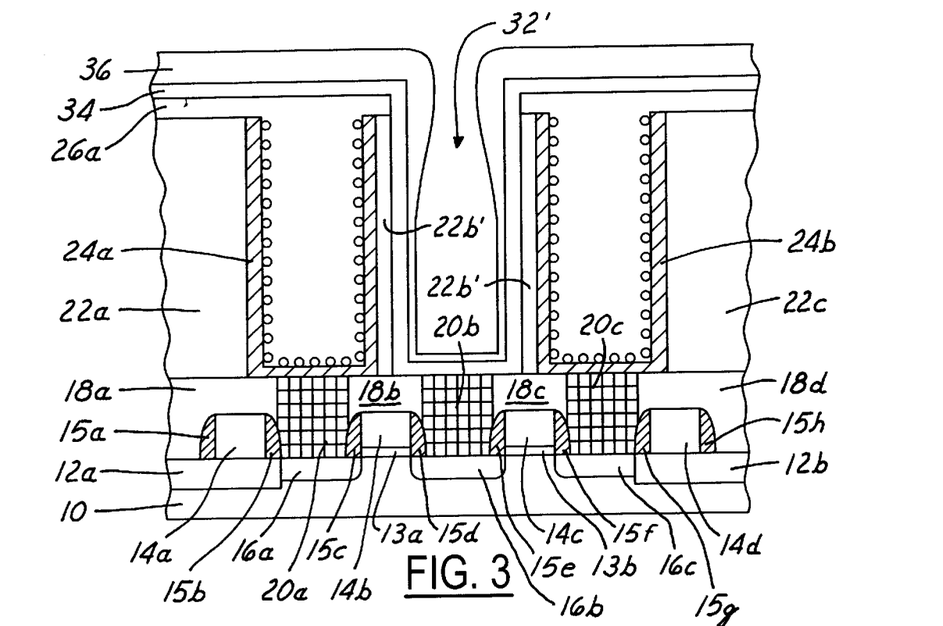

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance, the pair of patterned photoresist layers 28a and 28b has been stripped from the pair of patterned second capacitor plate layers 26a and 26b. The pair of patterned photoresist layers 28a and 28b may be stripped employing methods and materials as are conventional in the art of semiconductor integrated circuit microelectronic fabrication, including but not limited to wet chemical stripping methods and dry plasma stripping methods.

Similarly, there is also illustrated within the schematic cross-sectional diagram of FIG. 3, formed upon the semiconductor integrated circuit microelectronic fabrication once having stripped therefrom the pair of patterned photoresist layers 28a and 28b, two blanket layers. The two blanket layers are: (1) a blanket conformal isolation layer 34 formed upon exposed portions of the pair of patterned second capacitor plate layers 26a and 26b, the pair of twice patterned capacitor node dielectric layers 22b' and 22b", the pair of patterned planarized pre-metal dielectric (PMD) layers 18b and 18c and the conductive landing stud 20b; and (2) a blanket variable thickness masking layer 36 formed upon the blanket conformal isolation layer 34. As is illustrated within the schematic cross-sectional diagram of FIG. 3, the foregoing two blanket layers partially fill the contact aperture 32 as illustrated within the schematic cross-sectional diagram of FIG. 2 to form therefrom a partially filled contact aperture 32'.

Within the preferred embodiment of the present invention with respect to the blanket conformal isolation layer 34, the blanket conformal isolation layer 34 is intended to isolate the pair of patterned second capacitor plate layers 26a and 26b from a bitline stud layer to be formed incident to further processing of the semiconductor integrated circuit microelectronic fabrication whose schematic cross-sectional diagram is illustrated in FIG. 3. The blanket conformal isolation layer 34 may be formed from any of several isolation dielectric materials as are conventional or non-conventional in the art of microelectronic fabrication, including but not limited to silicon oxide dielectric materials, silicon nitride dielectric materials and silicon oxynitride dielectric materials, although silicon oxide dielectric materials are typically preferred. Significant to the present invention is that the blanket conformal isolation layer 34 is formed conformally (i.e., of a single uniform thickness) typically and preferably from about 500 to about 1000 angstroms. To realize such conformality, the blanket conformal isolation layer 34 is typically and preferably formed employing a low pressure chemical vapor deposition (LPCVD) method, and not a plasma enhanced chemical vapor deposition (PECVD) method or a physical vapor deposition (PVD) sputtering method, insofar as the latter two deposition methods generally exhibit inhomogeneous step coverage characteristics.

Within the preferred embodiment of the present invention with respect to the blanket variable thickness masking layer 36, and in contrast with the blanket conformal isolation layer 34, the blanket variable thickness masking layer 36 has a greater thickness upon the blanket conformal isolation layer 34 over the top surfaces of the patterned second capacitor plate layers 26a and 26b than it does upon the blanket conformal isolation layer 34 adjacent the sidewalls or over the bottom of the partially filled contact aperture 32' (i.e., interposed between the pair of patterned second capacitor plate layers 26a and 26b). Typically and preferably, the blanket variable thickness masking layer 36 will have a thickness of from about 500 to about 1000 angstroms over the upper surfaces of the patterned second capacitor plate layers 26a and 26b and a thickness of from about 100 to about 300 angstroms forming the sidewalls and the floor of the partially filled contact aperture 32'.

Within the preferred embodiment of the present invention, the variable thickness blanket masking layer 36 may be formed of masking materials as are conventional or unconventional in the art of microelectronic fabrication, including but not limited to conductor masking materials, semiconductor masking materials and dielectric masking materials, but will not be formed conformally. Typically and preferably, the blanket variable thickness masking layer 36 is formed employing a plasma enhanced chemical vapor deposition (PECVD) method or a physical vapor deposition (PVD) sputtering method which will provide the variable thickness of the variable thickness blanket masking layer as noted above. The blanket variable thickness masking layer 36 is typically and preferably not formed employing a low pressure chemical vapor deposition (LPCVD) method, which would provide the blanket variable thickness masking layer 36 of a uniform thickness.

Within the preferred embodiment of the present invention, generally, a silicon nitride material is preferred when forming the blanket variable thickness masking layer 36 of a dielectric material and a titanium nitride material is preferred when forming the blanket variable thickness masking layer 36 of a conductor material.

Figure 4:
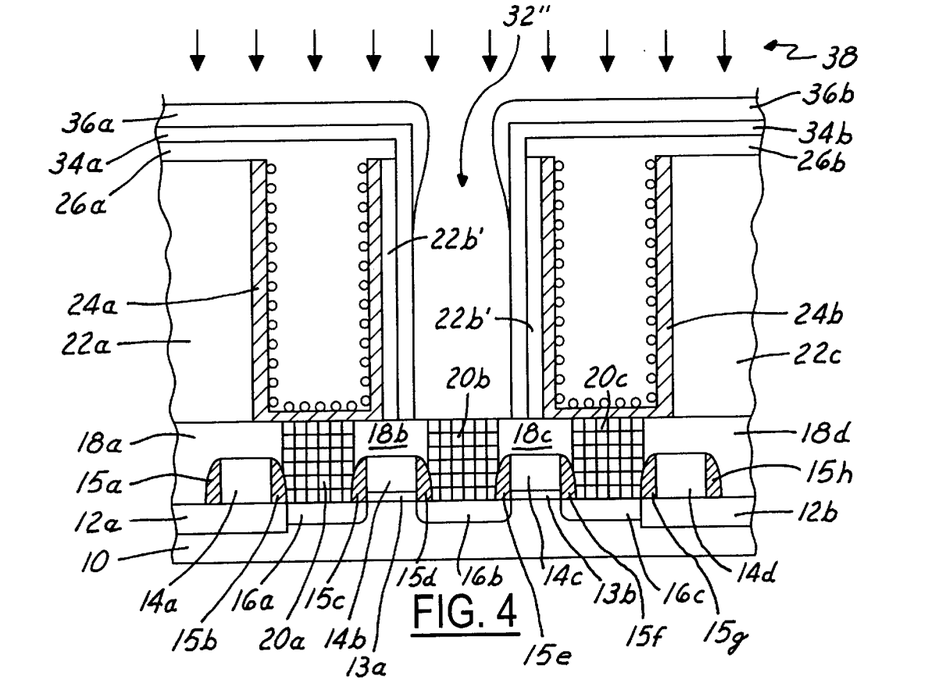

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein the blanket variable thickness masking layer 36 and the blanket conformal isolation layer 34 have been completely etched through with a second etching plasma 38 at their lower topographic regions within the partially filled contact aperture 32', but not at their upper topographic regions above the patterned second capacitor plate layers 26a and 26b, to form a pair of patterned conformal isolation layers 34a and 34b having formed thereupon a pair of patterned variable thickness masking layers 36a and 36b formed over the pair of patterned second capacitor plate layers 26a and 26b. As is also illustrated within the schematic cross-sectional diagram of FIG. 4, by completely etching through the blanket variable thickness masking layer 36 and the blanket conformal isolation layer 34 at their lower topographic regions, there is formed from the partially filled contact aperture 32' a bitline contact via 32" which again leaves exposed the conductive landing stud 20b.

Within the preferred embodiment of the present invention, the second etching plasma 38 will typically and preferably employ an etchant gas composition, or series thereof, with an etch specificity for the material from which is formed blanket conformal isolation layer 34 with respect to the material from which is formed the blanket variable thickness masking layer 36. However, there may also be employed a brief breakthrough etch for removal of the blanket variable thickness masking layer 36 within the partially filled contact aperture 32'.

As is illustrated within the schematic cross-sectional diagram of FIG. 4, the etching of the blanket variable thickness masking layer 36 and the blanket conformal isolation layer 34 is undertaken in a self aligned fashion (i.e., with no additional masking), and relies upon the thickness difference of the blanket variable thickness masking layer 36 to selectively mask the blanket conformal isolation layer 34 at its upper topographic region, but not its lower topographic region. Typically and preferably a remaining thickness of the pair of patterned variable thickness masking layers 36a and 36b formed over the patterned second capacitor plate layers 26a and 26b is from about 100 to about 700 angstroms.

Figure 5:
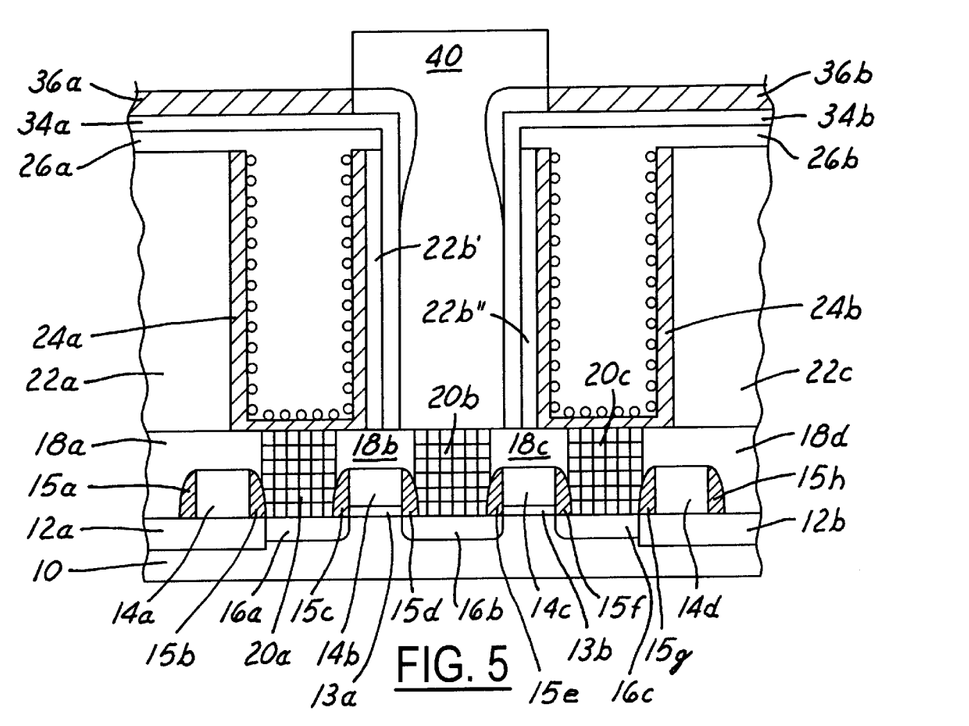

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there is formed within the bitline contact via 32" a bitline stud layer 40.

The bitline stud layer 40 may be formed employing methods and materials as are conventional in the art of semiconductor integrated circuit microelectronic fabrication, including but not limited to metals, metal alloys, doped polysilicon and polycide conductor materials.

Within the preferred embodiment of the present invention when the blanket variable thickness masking layer 36 is formed of a dielectric masking material, such as but not limited to a silicon oxide material or a silicon nitride material, the bitline stud layer 40 is typically and preferably formed of a doped polysilicon conductor material. Similarly, within the preferred embodiment of the present invention when the blanket variable thickness masking layer 36 is formed of a conductor material, such as but not limited to a titanium nitride conductor material, the bitline stud layer 40 may more preferably be formed of a tungsten metal conductor material. Under the latter circumstances, the pair of patterned variable thickness masking layers will typically and preferably be further patterned to align with the edges of the bitline stud layer 40 to attenuate leakage therefrom. The bitline stud layer 40 if preferably formed in a "T" shape to facilitate alignment thereto.

Upon forming the semiconductor integrated circuit microelectronic fabrication whose schematic cross-sectional diagram is illustrated in FIG. 5, there is formed a semiconductor integrated circuit microelectronic fabrication having formed therein a memory cell structure with enhanced reliability and enhanced performance. The memory cell structure realizes the foregoing objects by forming a bitline contact via in a self aligned fashion while employing a blanket variable thickness masking layer as an etch mask layer.

As is understood by a person skilled in the art, the preferred embodiment of the present invention is illustrative of the present invention rather than limiting of the present invention. Revisions and modifications may be made to methods, materials, structures and dimensions through which is provided a semiconductor integrated circuit microelectronic fabrication in accord with the preferred embodiment of the present invention, while still providing a method for forming a contact via in accord with the present invention, further in accord with the accompanying claims.

What is claimed is:

1. A method for forming a contact via comprising:
   providing a substrate;
   forming over the substrate a pair of topographic structures which is separated by a contact region formed within the substrate;
   forming upon the substrate and the pair of topographic structures a blanket conformal isolation layer having an upper region formed upon the pair of topographic structures and a lower region formed interposed between the pair of topographic structures and over the contact region;
   forming upon the blanket conformal isolation layer a blanket variable thickness masking layer having a greater thickness over the upper region of the blanket conformal isolation layer than over the lower region of the blanket conformal isolation layer;
   etching completely through the blanket variable thickness masking layer and the blanket conformal isolation layer at the lower region of the blanket conformal isolation layer but not the upper region of the blanket conformal isolation layer to form a pair of patterned conformal isolation layers and a pair of patterned variable thickness masking layers which define a contact via exposing the contact region.

2. The method of claim 1 wherein the pair of topographic structures is formed from a material selected from the group consisting of conductor materials, semiconductor materials and dielectric materials.

3. The method of claim 1 wherein the blanket conformal isolation layer is formed to a thickness of from about 500 to about 1000 angstroms.

4. The method of claim 1 wherein the blanket variable thickness masking layer is formed from a masking material selected from the group consisting of conductor masking materials, semiconductor masking materials and dielectric masking materials.

5. The method of claim 1 wherein:
   the blanket variable thickness masking layer has a thickness of from about 500 to about 1000 angstroms at its upper topographic region; and
   the blanket variable thickness masking layer has a thickness of from about 100 to about 300 at its lower topographic region.

6. A method for fabricating a memory cell structure comprising:
   providing a semiconductor substrate;
   forming within and upon the semiconductor substrate a pair of field effect transistor (FET) devices comprising a series of three source/drain regions formed into the semiconductor substrate and separated by a pair of gate electrodes formed over the semiconductor substrate;
   forming over the pair of field effect transistor (FET) devices, and electrically connected with two of the series of three source/drain regions, a pair of capacitor structures defining a contact aperture having at its bottom a contact region for a third of the series of three source/drain regions;
   forming upon the pair of capacitor structures and within the contact aperture a blanket conformal isolation layer having an upper region formed upon the pair of capacitor structures and a lower region formed interposed between the pair of capacitor structures;
   forming upon the blanket conformal isolation layer a blanket variable thickness masking layer having a greater thickness over the upper region of the blanket conformal isolation layer than over the lower region of the blanket conformal isolation layer;
   etching completely through the blanket variable thickness masking layer and the blanket conformal isolation layer at the lower region of the blanket conformal isolation layer but not the upper region of the blanket conformal isolation layer to form a pair of patterned conformal isolation layers and a pair of patterned variable thickness masking layers which define a contact via exposing the contact region for the third of the series of three source/drain regions.

7. The method of claim 6 wherein the blanket conformal isolation layer is formed to a thickness of from about 500 to about 1000 angstroms.

8. The method of claim 6 wherein:
   the blanket variable thickness masking layer has a thickness of from about 500 to about 1000 angstroms at its upper topographic region; and
   the blanket variable thickness masking layer has a thickness of from about 100 to about 300 at its lower topographic region.

9. The method of claim 6 wherein the patterned variable thickness masking layer is formed to a thickness of from about 100 to about 700 angstroms.

10. A method for fabricating a memory cell structure comprising:

provinding a semiconductor substrate;

forming within and upon the semiconductor substrate a pair of field effect transistor (FET) devices comprising a series of three source/drain regions formed into the semiconductor substrate and separated by a pair of gate electrodes formed over the semiconductor substrate;

forming over the pair of field effect transistor (FET) devices, and electrically connected with two of the series of three source/drain regions, a pair of capacitor structures defining a contact aperture having at its bottom a contact region for a third of the series of three source/drain regions;

forming upon the pair of capacitor structures and within the contact aperture a blanket conformal isolation layer having an upper region formed upon the pair of capacitor structures and a lower region formed interposed between the pair of capacitor structures;

forming upon the blanket conformal isolation layer a blanket variable thickness dielectric masking layer having a greater thickness over the upper region of the blanket conformal isolation layer than over the lower region of the blanket conformal isolation layer;

etching completely through the blanket variable thickness dielectric masking layer and the blanket conformal isolation layer at the lower region of the blanket conformal isolation layer but not the upper region of the blanket conformal isolation layer to form a pair of patterned conformal isolation layers and a pair of patterned variable thickness dielectric masking layers which define a contact via exposing the contact region for the third of the series of three source/drain regions.

11. The method of claim 10 wherein the blanket conformal isolation layer is formed to a thickness of from about 500 to about 1000 angstroms.

12. The method of claim 10 wherein:

the blanket variable thickness dielectric masking layer has a thickness of from about 500 to about 1000 angstroms at its upper topographic region; and the blanket variable thickness dielectric masking layer has a thickness of from about 100 to about 300 at its lower topographic region.

13. The method of claim 10 wherein the patterned variable thickness dielectric masking layer is formed to a thickness of from about 100 to about 700 angstroms.

14. A method for fabricating a memory cell structure comprising:

providing a semiconductor substrate;

forming within and upon the semiconductor substrate a pair of field effect transistor (FET) devices comprising a series of three source/drain regions formed into the semiconductor substrate and separated by a pair of gate electrodes formed over the semiconductor substrate;

forming over the pair of field effect transistor (FET) devices, and electrically connected with two of the series of three source/drain regions, a pair of capacitor structures defining a contact aperture having at its bottom a contact region for a third of the series of three source/drain regions;

forming upon the pair of capacitor structures and within the contact aperture a blanket conformal isolation layer having an upper region formed upon the pair of capacitor structures and a lower region formed interposed between the pair of capacitor structures;

forming upon the blanket conformal isolation layer a blanket variable thickness conductor masking layer having a greater thickness over the upper region of the blanket conformal isolation layer than over the lower region of the blanket conformal isolation layer;

etching completely through the blanket variable thickness conductor masking layer and the blanket conformal isolation layer at the lower region of the blanket conformal isolation layer but not the upper region of the blanket conformal isolation layer to form a pair of patterned conformal isolation layers and a pair of patterned variable thickness conductor masking layers which define a contact via exposing the contact region for the third of the series of three source/drain regions.

15. The method of claim 14 wherein the blanket conformal isolation layer is formed to a thickness of from about 500 to about 1000 angstroms.

16. The method of claim 14 wherein:

the blanket variable thickness conductor masking layer has a thickness of from about 500 to about 1000 angstroms at its upper topographic region; and the blanket variable thickness conductor masking layer has a thickness of from about 100 to about 300 at its lower topographic region.

17. The method of claim 14 wherein the patterned variable thickness conductor masking layer is formed to a thickness of from about 100 to about 700 angstroms.

* * * * *